United States Patent
Lin et al.

(10) Patent No.: US 8,895,435 B2
(45) Date of Patent: Nov. 25, 2014

(54) POLYSILICON LAYER AND METHOD OF FORMING THE SAME

(75) Inventors: Chien-Liang Lin, Taoyuan County (TW); Yun-Ren Wang, Tainan (TW); Ying-Wei Yen, Miaoli County (TW); Wen-Yi Teng, Kaohsiung (TW); Chan-Lon Yang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 883 days.

(21) Appl. No.: 13/018,009

(22) Filed: Jan. 31, 2011

(65) Prior Publication Data

US 2012/0193796 A1    Aug. 2, 2012

(51) Int. Cl.

| H01L 21/00 | (2006.01) |
|---|---|
| H01L 21/20 | (2006.01) |
| H01L 21/36 | (2006.01) |
| H01L 21/44 | (2006.01) |
| H01L 23/48 | (2006.01) |
| H01L 23/52 | (2006.01) |
| H01L 29/40 | (2006.01) |
| H01L 21/28 | (2006.01) |
| H01L 29/49 | (2006.01) |
| H01L 21/265 | (2006.01) |

(52) U.S. Cl.
CPC ...... H01L 21/28035 (2013.01); H01L 29/4925 (2013.01); *H01L 21/26506* (2013.01); *H01L 21/26513* (2013.01)
USPC ............. 438/657; 438/97; 438/488; 438/684; 257/754; 257/756; 257/E23.164

(58) Field of Classification Search
CPC ............ H01L 21/28229; H01L 21/321; H01L 21/32137; H01L 21/28035; H01L 21/28518; H01L 21/76889; H01L 21/26506; H01L 21/26513; H01L 29/4925; H01L 23/53271; H01L 23/485; H01L 23/53223; H01L 21/285; H01L 21/76838; H01L 21/76877; H01L 21/28525; H01L 21/76895
USPC ........... 438/97, 488, 532, 564, 657, 684, 764; 257/754, 756, E23.164
See application file for complete search history.

(56) References Cited

U.S. PATENT DOCUMENTS

| 5,141,892 | A | * | 8/1992 | Beinglass | 438/684 |
|---|---|---|---|---|---|
| 6,093,589 | A | * | 7/2000 | Lo et al. | 438/197 |
| 6,143,618 | A | * | 11/2000 | Chen et al. | 438/396 |
| 6,667,525 | B2 | * | 12/2003 | Rhee et al. | 257/407 |
| 6,703,289 | B2 | * | 3/2004 | Muramatsu et al. | 438/486 |
| 6,902,977 | B1 | * | 6/2005 | Kluth et al. | 438/261 |
| 6,962,861 | B2 | * | 11/2005 | Luoh | 438/488 |
| 6,991,999 | B2 | * | 1/2006 | Fu et al. | 438/488 |
| 2002/0189664 | A1 | * | 12/2002 | Ishihara | 136/258 |

(Continued)

FOREIGN PATENT DOCUMENTS

JP    11177041 A  *  7/1999  ............ H01L 27/108

*Primary Examiner* — Teresa M Arroyo
(74) *Attorney, Agent, or Firm* — J.C. Patents

(57) ABSTRACT

The method of forming a polysilicon layer is provided. A first polysilicon layer with a first grain size is formed on a substrate. A second polysilicon layer with a second grain size is formed on the first polysilicon layer. The first grain size is smaller than the second grain size. The first polysilicon layer with a smaller grain size can serve as a base for the following deposition, so that the second polysilicon layer formed thereon has a flatter topography, and thus, the surface roughness is reduced and the Rs uniformity within a wafer is improved.

13 Claims, 4 Drawing Sheets

(56) References Cited

U.S. PATENT DOCUMENTS

| | | | |
|---|---|---|---|
| 2003/0030052 A1* | 2/2003 | Oka et al. | 257/65 |
| 2003/0045081 A1* | 3/2003 | Lin et al. | 438/592 |
| 2003/0047734 A1* | 3/2003 | Fu et al. | 257/64 |
| 2003/0124818 A1* | 7/2003 | Luo et al. | 438/482 |
| 2003/0168578 A1* | 9/2003 | Taguchi et al. | 250/214.1 |
| 2003/0219961 A1* | 11/2003 | Lee | 438/478 |
| 2004/0009651 A1* | 1/2004 | Han et al. | 438/478 |
| 2004/0213907 A1* | 10/2004 | Todd et al. | 427/255.18 |
| 2005/0022864 A1* | 2/2005 | Fujioka et al. | 136/258 |
| 2005/0085003 A1* | 4/2005 | Kishimoto et al. | 438/97 |
| 2005/0106842 A1* | 5/2005 | Luoh | 438/488 |
| 2008/0271783 A1* | 11/2008 | Murakami et al. | 136/258 |
| 2009/0011611 A1* | 1/2009 | Ichijo et al. | 438/769 |
| 2009/0178711 A1* | 7/2009 | Joo et al. | 136/258 |
| 2010/0258169 A1* | 10/2010 | Sheng et al. | 136/255 |

\* cited by examiner

POLYSILICON LAYER AND METHOD OF FORMING THE SAME

BACKGROUND OF THE INVENTION

1. Field of Invention

The present invention relates to a polysiliocn layer and a method of forming the same, and more generally to a polysiliocn layer with different grain sizes and a method of forming the same.

2. Description of Related Art

As the design rule of a semiconductor device is scaled down, the standard for the flatness of the gate is accordingly increased. The gate is usually formed from polysilicon by a chemical vapor deposition (CVD) process. It is found that when the surface of the polysilicon layer is not flat enough, the surface roughness (Rq and Ra) of the polysilicon layer and the sheet resistance (Rs) uniformity within a wafer are affected, and the performance of the device is degraded.

Therefore, how to form a uniform polysilicon layer to improve the device performance has been one of the main topics in the industry.

SUMMARY OF THE INVENTION

The present invention provides a polysiliocn layer with different grain sizes, in which smaller grains serving as a base are formed below larger grains, so that the surface uniformity of the polysilicon layer is improved. The present invention further provides a method to form the above-mentioned polysilicon layer.

The present invention provides a method of forming a polysilicon layer. A first polysilicon layer is formed on a substrate, wherein the first polysilicon layer is formed by introducing a silicon-containing gas and an inhibitive gas, and the inhibitive gas is for inhibiting a decomposition rate of the silicon-containing gas. Thereafter, a second polysilicon layer is formed on the first polysilicon layer, wherein the second polysilicon layer is formed by introducing the silicon-containing gas.

According to an embodiment of the present invention, the first polysilicon layer is amorphous while the second polysilicon layer is crystallized.

According to an embodiment of the present invention, the silicon-containing gas includes silane or disilane, and the inhibitive gas comprises hydrogen.

According to an embodiment of the present invention, the first polysilicon layer has a first grain size, the second polysilicon layer has a second grain size, and the first grain size is smaller than the second grain size.

According to an embodiment of the present invention, a flow rate ratio of the silicon-containing gas to the inhibitive gas is from about 1:50 to about 1:60.

According to an embodiment of the present invention, a flow rate of the silicon-containing gas is about 50-60 sccm, and a flow rate of the inhibitive gas is about 2,500-3,600 sccm.

According to an embodiment of the present invention, a flow rate of the silicon-containing gas keeps the same, and a flow rate of the inhibitive gas keeps the same or increases over time.

According to an embodiment of the present invention, the first polysilicon layer and the second polysilicon layer are formed at the same temperature of about 700-750° C.

According to an embodiment of the present invention, a temperature of forming the first polysilicon layer is lower than a temperature of forming the second polysilicon layer.

According to an embodiment of the present invention, the temperature of forming the first polysilicon layer is about 550-650° C., and the temperature of forming the second polysilicon layer is about 700-750° C.

According to an embodiment of the present invention, a thickness of the first polysilicon layer is smaller than a thickness of the second polysilicon layer.

According to an embodiment of the present invention, a thickness ratio of the first polysilicon layer to the second polysilicon layer is from about 1:2.5 to about 1:6.

According to an embodiment of the present invention, the thickness of the first polysilicon layer is about 100-200 Å, and the thickness of the second polysilicon layer is about 500-600 Å.

According to an embodiment of the present invention, the method further includes performing a first ion implantation process after the step of forming the second polysilicon layer to dope the second polysilicon layer.

According to an embodiment of the present invention, the method further includes performing a second ion implantation process before the step of performing the first ion implantation process, so as to form a barrier layer in the second polysilicon layer to prevent dopants from diffusing to the first polysilicon layer.

The present invention also provides a polysilicon layer including an amorphous polysilicon layer and a crystallized polysilicon layer disposed on the amorphous polysilicon layer.

According to an embodiment of the present invention, the amorphous polysilicon layer has a first grain size, the crystallized polysilicon layer has a second grain size, and the first grain size is smaller than the second grain size.

According to an embodiment of the present invention, the first grain size is about 10-20 nm, and the second grain size is about 25-30 nm.

According to an embodiment of the present invention, a thickness of the amorphous polysilicon layer is smaller than a thickness of the crystallized polysilicon layer.

According to an embodiment of the present invention, a thickness ratio of the amorphous polysilicon layer to the crystallized polysilicon layer is from about 1:2.5 to about 1:6.

According to an embodiment of the present invention, the thickness of the amorphous polysilicon layer is about 100-200 Å, and the thickness of the crystallized polysilicon layer is about 500-600 Å.

According to an embodiment of the present invention, the amorphous polysilicon layer is undoped, while the crystallized polysilicon layer is doped.

According to an embodiment of the present invention, at least a doped layer is disposed in the crystallized polysilicon layer to prevent dopants from diffusing to the amorphous polysilicon layer.

According to an embodiment of the present invention, at least a doped layer is substantially disposed at an interface between the amorphous polysilicon layer and the crystallized polysilicon layer or higher than the interface.

According to an embodiment of the present invention the amorphous polysilicon layer and the crystallized polysilicon layer have a total height H, and at least a doped layer is disposed larger than or equal to $\frac{2}{3}H$ from a top surface of the crystallized polysilicon layer.

In view of above, the first polysilicon layer with a smaller grain size is formed by introducing an inhibitive gas or lowering a chamber temperature to inhibit the decomposition rate of the silicon-containing gas. The first polysilicon layer with the smaller grain size can serve as a base for the following deposition, so that the second polysilicon layer formed thereon has a flatter topography. Accordingly, the surface roughness of the polysilicon layer is reduced, the Rs uniformity within a wafer is improved, and the performance of the device is enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
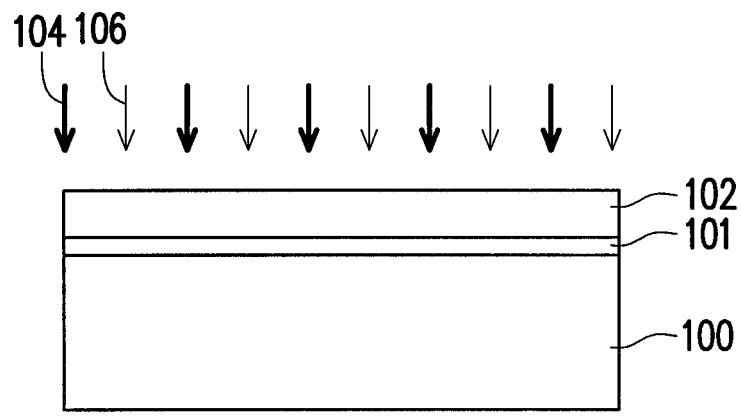
FIGS. 1A to 1C schematically illustrate, in a cross-sectional view, a method of forming a polysilicon layer according to a first embodiment of the present invention.
Figure 1B:
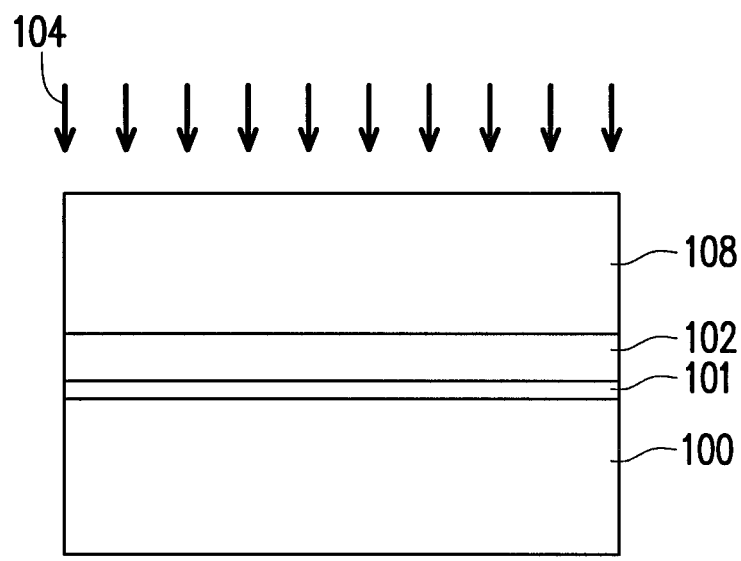
Figure 1C:
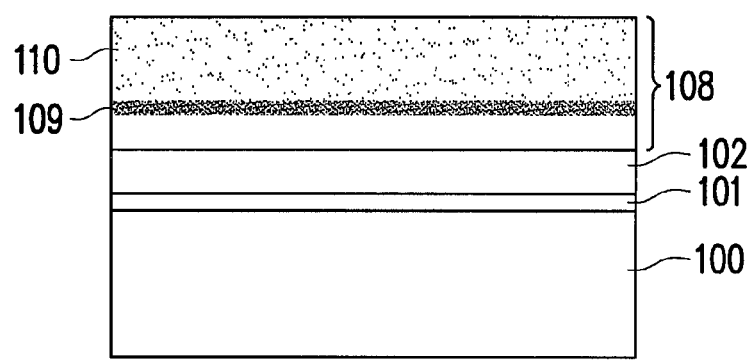

FIGS. 1A to 1C schematically illustrate, in a cross-sectional view, a method of forming a polysilicon layer according to a first embodiment of the present invention.

Referring to FIG. 1A, a first polysilicon layer 102 with a first grain size is formed on a substrate 100. The substrate 100 can be a semiconductor substrate, such as a silicon substrate. The first polysilicon layer 102 is formed by introducing a silicon-containing gas 104 and an inhibitive gas 106 into a CVD chamber. The silicon-containing gas 104 includes silane ($SiH_4$) or disilane ($Si_2H_6$), for example. The inhibitive gas 106 is for inhibiting the decomposition rate of the silicon-containing gas 104. The inhibitive gas 106 includes hydrogen ($H_2$), for example. The flow rate ratio of the silicon-containing gas 104 to the inhibitive gas 106 is from about 1:50 to about 1:60. For example, the flow rate of the silicon-containing gas 104 is about 50-60 sccm, and the flow rate of the inhibitive gas 106 is about 2,500-3,600 sccm. In an embodiment, the flow rates of the silicon-containing gas 104 and the inhibitive gas 106 keep the same during the process step. In another embodiment, the flow rate of the silicon-containing gas 104 keeps the same, while the flow of the inhibitive gas 106 increases over time. The chamber temperature is about 700-750° C., and the chamber pressure is about 50-500 torr. The formed first grain size is about 10-20 nm under the described process condition.

In an embodiment, an insulating layer 101 is optionally formed between the substrate 100 and the first polysilicon layer 102. The method of forming the insulating layer 101 includes performing a thermal oxidation process or a CVD process, for example. The insulating layer 101 includes silicon oxide or a high-k material, for example.

Referring to FIG. 1B, a second polysilicon layer 108 with a second grain size is formed on the first polysilicon layer 102. The second polysilicon layer 108 is formed by introducing the silicon-containing gas 104 into the same CVD chamber. That is, the entire deposition sequence is an in situ process. In operation, the valve for controlling the inhibitive gas 106 is simply turned off without changing other process parameters (i.e. chamber temperature, pressure, time, etc.) Since the inhibitive gas 106 is not present, the silicon-containing gas 104 (e.g. disilane) is decomposed more quickly and larger silicon grains are formed. Accordingly, the second grain size is about 25-30 nm and greater than the first grain size.

In addition, the thickness of the first polysilicon layer 102 is smaller than that of the second polysilicon layer 108. The thickness ratio of the first polysilicon layer 102 to the second polysilicon layer 108 is from about 1:2.5 to about 1:6. For example, the thickness of the first polysilicon layer 102 is about 100-200 Å, and the thickness of the second polysilicon layer 108 is about 500-600 Å.

Referring to FIG. 1C, a first ion implantation process is performed to the second polysilicon layer 108, so as to dope the second polysilicon layer 108 and form a doped region 110 in the second polysilicon layer 108. The first ion implantation process is for reducing the poly sheet resistance (poly Rs). In an embodiment, the doped region 110 includes phosphor for a NMOS transistor, example. In another embodiment, the doped region 110 includes boron for a PMOS transistor, for example.

If required, a second ion implantation process is performed before the step of performing a first ion implantation process, so as to form a barrier layer 109 in the second polysilicon layer 108 to prevent dopants from diffusing to the first polysilicon layer 102. In an embodiment, the barrier layer 109 includes germanium for a NMOS transistor, example. In another embodiment, the barrier layer 109 includes germanium for a PMOS transistor, for example.

Further, when the first polysilicon layer 102 and the second polysilicon layer 108 have a total height H, the barrier layer 109 and the bottom of the doped region 110 are disposed larger than or equal to $\frac{2}{3}H$ from the top surface of the second polysilicon layer 108. In this embodiment, the interface between the first polysilicon layer 102 and the second polysilicon layer 108, the barrier layer 109, and the bottom of the doped region 110 are substantially at the same depth. However, the present invention is not limited thereto. It is appreciated by persons skilled in the art that the interface between the first polysilicon layer 102 and the second polysilicon layer 108, the barrier layer 109, and the bottom of the doped region 110 can be at different depths.

Thereafter, an annealing process is performed to substrate 100, so as to repair the damage caused by the above-mentioned ion implantation processes.

In the first embodiment, the first polysilicon layer 102 with a smaller grain size is formed by introducing the inhibitive gas 106 to inhibit the decomposition rate of the silicon-containing gas 104. It is noted that the first polysilicon layer 102 with the smaller grain size can serve as a base for the following deposition, so that the second polysilicon layer 108 formed thereon has a flatter topography, and thus, the surface roughness is reduced and the Rs uniformity within a wafer is improved. It is also noted that the first polysilicon layer 102 is amorphous while the second polysilicon layer 108 is crystallized.

Second Embodiment

Figure 2A:
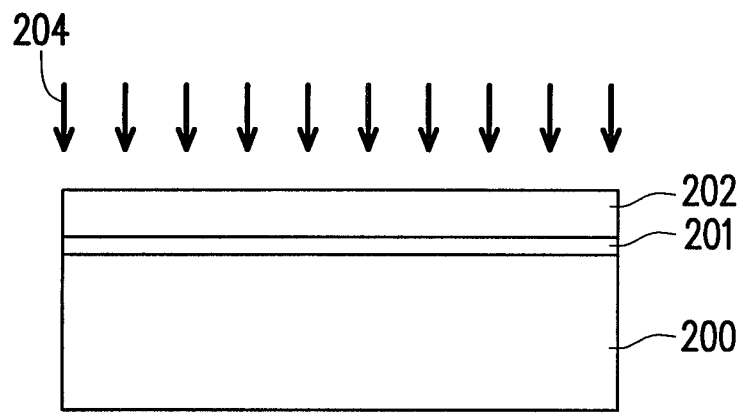
FIGS. 2A to 2C schematically illustrate, in a cross-sectional view, a method of forming a polysilicon layer according to a second embodiment of the present invention.
Figure 2B:
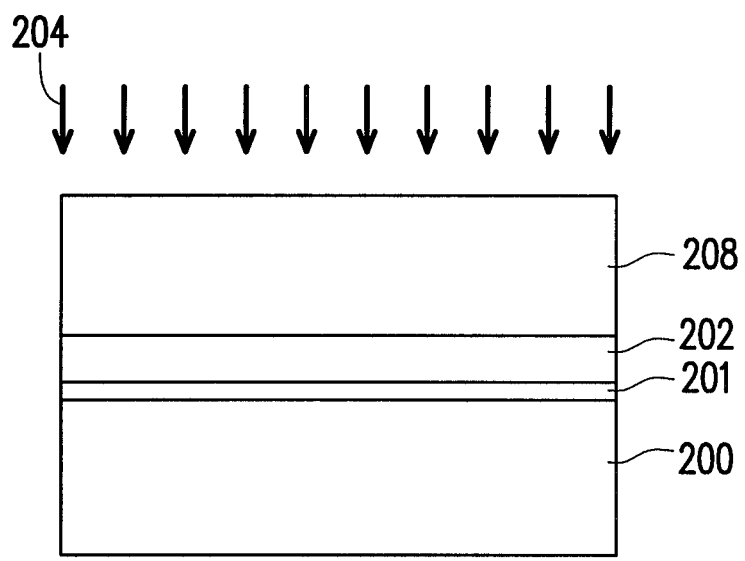
Figure 2C:
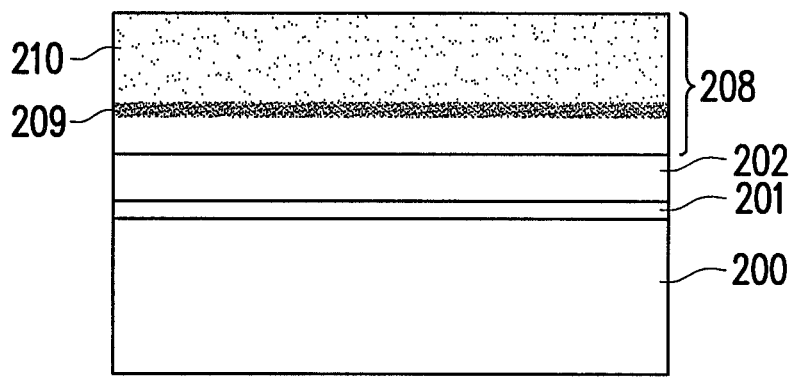

FIGS. 2A to 2C schematically illustrate, in a cross-sectional view, a method of forming a polysilicon layer according to a second embodiment of the present invention.

Referring to FIG. 2A, a first polysilicon layer 202 with a first grain size is formed on a substrate 200. The substrate 200 can be a semiconductor substrate, such as a silicon substrate. The first polysilicon layer 202 is formed by introducing a silicon-containing gas 204 into a lower-temperature CVD chamber. The silicon-containing gas 204 includes silane (SiH$_4$) or disilane (Si$_2$H$_6$), for example. The chamber temperature is about 550-650° C. and lower than the conventional chamber temperature of about 700-750° C. The flow rate of the silicon-containing gas 204 is about 50-60 sccm, and the chamber pressure is about 50-500 torr. The lower chamber temperature decreases the decomposition rate of the silicon-containing gas 204, so that smaller silicon grains are formed. Accordingly, the formed first grain size is about 10-20 nm.

In an embodiment, an insulating layer 201 is optionally formed between the substrate 200 and the first polysilicon layer 202. The forming method and the material of the insulating layer 201 are similar to those of the insulating layer 101 in the first embodiment, and the details are not iterated herein.

Referring to FIG. 2B, a second polysilicon layer 208 with a second grain size is formed on the first polysilicon layer 202. The second polysilicon layer 208 is formed by introducing the silicon-containing gas 204 into another higher-temperature CVD chamber. The chamber temperature is about 700-750° C. and similar to the conventional chamber temperature. In operation, the substrate 200 is sequentially transferred to the lower-temperature CVD chamber and the higher-temperature CVD chamber, while other process parameters (i.e. gas composition, gas flow rate, chamber pressure, time, etc.) between the two chambers keep the same. Higher chamber temperature results in larger silicon grains. Accordingly, the formed second grain size is about 25-30 nm and greater than the first grain size.

In addition, the thickness ranges of the first polysilicon layer 202 and the second polysilicon layer 208 are similar to those of the first polysilicon layer 102 and the second polysilicon layer 108 in the first embodiment, and the details are not iterated herein.

Referring to FIG. 2C, a first ion implantation process is performed to the second polysilicon layer 208, so as to dope the second polysilicon layer 208 and form a doped region 210 in the second polysilicon layer 208. If required, a second ion implantation process is performed before the step of performing a first ion implantation process, so as to form a barrier layer 209 in the second polysilicon layer 208 to prevent dopants from diffusing to the first polysilicon layer 202. The dopant types used for the first and second implantation processes have been described above, and the details are not iterated herein. Thereafter, an annealing process is performed to substrate 200, so as to repair the damage caused by the above-mentioned ion implantation processes.

In the second embodiment, the first polysilicon layer 202 with a smaller grain size is formed by lowering the chamber temperature to decrease the decomposition rate of the silicon-containing gas 204. It is noted that the first polysilicon layer 202 with the smaller grain size can serve as a base for the following deposition, so that the second polysilicon layer 208 formed thereon has a flatter topography, and thus, the surface roughness is reduced and the Rs uniformity within a wafer is improved. It is also noted that the first polysilicon layer 202 is amorphous while the second polysilicon layer 208 is crystallized.

The above-mentioned embodiments in which different process conditions are described are provided for illustration purposes, and are not construed as limiting the present invention. Specifically, in the first embodiment, different forming gases are used for forming the first polysilicon layer 202 and the second polysilicon layer 208. In the second embodiment, different forming temperatures are used for forming the first polysilicon layer 202 and the second polysilicon layer 208. However, the present invention is not limited thereto. It is appreciated by persons skilled in the art that the process conditions of the first and second embodiments can be combined upon the requirement.

Figure 3:
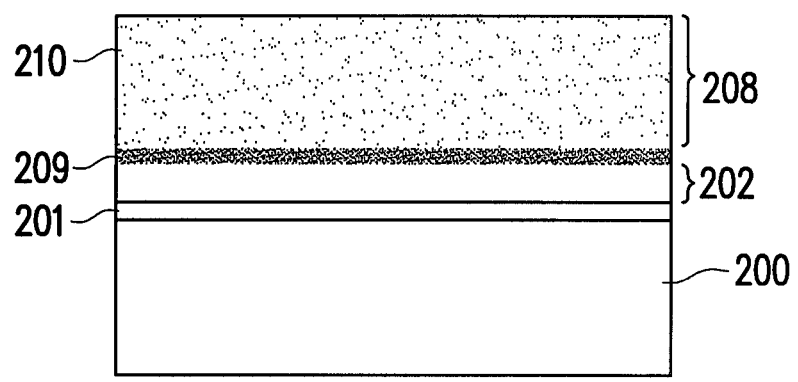
FIG. 3 schematically illustrates a cross-sectional view of a polysilicon layer according to an embodiment of the present invention.

The two-layer polysilicon structure of the present invention is illustrated by FIG. 2C in the following. Referring to FIG. 2C, the polsilicon layer of the present invention includes a first polysilicon layer 202 with a first grain size and a second polysilicon layer 208 with a second grain size, wherein the first grain size is smaller than the second grain size. Specifically, the first polysilicon layer 202 is an amorphous polysilicon layer while the second polysilicon layer 208 is a crystallized polysilicon layer. In an embodiment, the first grain size is about 10-20 nm, and the second grain size is about 25-30 nm. The thickness of the first polysilicon layer 202 is smaller than that of the second polysilicon layer 208. The thickness ratio of the first polysilicon layer 202 to the second polysilicon layer 208 is from about 1:2.5 to about 1:6. In an embodiment, the thickness of the first polysilicon layer 202 is about 100-200 Å, and the thickness of the second polysilicon layer 208 is about 500-600 Å. It is noted that the first polysilicon layer 202 is undoped, while the second polysilicon layer 208 is doped. At least one doped layer (e.g. barrier layer 209) is further disposed in the second polysilicon layer 208 to prevent dopants in the doped region 210 from diffusing to the first polysilicon layer 202. In this embodiment, as shown in FIG. 2C, the barrier layer 209 is disposed higher than the interface between the first polysilicon layer 202 and the second polysilicon layer 208. When the first polysilicon layer 102 and the second polysilicon layer 108 have a total height H, the barrier layer 109 is disposed larger than or equal to ⅔H from the top surface of the second polysilicon layer 108. In another embodiment, as shown in FIG. 3, the barrier layer 209 is substantially disposed at the interface between the first polysilicon layer 202 and the second polysilicon layer 208.

An experimental group and a control group are provided below to prove the performance of the present invention.

Experimental Group

In accordance with the method of the present invention, a first polysilicon layer of 200 Å thick is formed on a silicon substrate by introducing disilane and hydrogen. Thereafter, a second polysilicon layer of 600 Å thick is formed on the first polysilicon layer by only introducing disilane. Afterwards, a germanium ion implantation process with a dose of 3E14 and an energy of 12 keV is performed to the second polysilicon layer, so as to form a barrier layer. Further, a phorphorous ion implantation process with a does of 5E15 and an energy of 5 KeV is performed to the second polysilicon layer, so as to form a doped region in the second polysilicon layer. Next, an activation annealing process is performed to the silicon substrate at 1025° C.

Control Group

A polysilicon layer of 800 Å thick is formed on a silicon substrate by only introducing disilane. Afterwards, a germanium ion implantation process with a dose of 3E14 and an energy of 12 keV is performed to the polysilicon layer, so as to form a barrier layer. Further, a phorphorous ion implantation process with a does of 5E15 and an energy of 5 KeV is performed to the polysilicon layer, so as to form a doped region in the polysilicon layer. Next, an activation annealing process is performed to the silicon substrate at 1025° C.

Table 1 lists the process parameters and testing results of the experimental group and the control group.

TABLE 1

| | Process step | Temp. (° C.) | Press. (torr) | Si$_2$H$_6$ (sccm) | H$_2$ (sccm) | Thk. (Å) | Grain size (nm) | Rq (nm) | Ra (nm) | Rs uniformity |
|---|---|---|---|---|---|---|---|---|---|---|
| Experimental Group | Step 1 | 710 | 50 | 60 | 3200 | 200 | 20 | 3.75 | 2.81 | 6.9% |
| | Step 2 | 710 | 50 | 60 | 0 | 600 | 25-30 | | | |
| Control Group | Single step | 710 | 50 | 60 | 0 | 800 | 25-30 | 4.25 | 3.18 | 10.2% |

* Ra means average roughness; Rq means root mean square roughness; Ra uniformity is obtained by measuring 121 points within a wafer.

Referring to Table 1, as compared with the single polysilicon layer in the control group, the two-layer polysilicon structure in the experimental group provides lower surface roughness (Rq and Ra) and better Rs uniformity within a wafer.

In summary, the first polysilicon layer with a smaller grain size is formed by introducing an inhibitive gas or lowering a chamber temperature to inhibit the decomposition rate of the silicon-containing gas. The first polysilicon layer with the smaller grain size can serve as a base for the following deposition, so that the second polysilicon layer formed thereon has a flatter topography. However, the present invention is not limited thereto. It is appreciated by persons skilled in the art that introducing the inhibitive gas and lowering the chamber temperature can be applied at the same time, so as to form a first polysilicon layer with an even smaller grain size serving as a base. Accordingly, the surface roughness of the polysilicon layer is reduced, the Rs uniformity within a wafer is improved, and the performance of the device is enhanced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of forming a polysilicon layer, comprising:
    forming a first polysilicon layer on a substrate, wherein the first polysilicon layer is formed by introducing a silicon-containing gas and an inhibitive gas, and the inhibitive gas is for inhibiting a decomposition rate of the silicon-containing gas; and
    forming a second polysilicon layer on the first polysilicon layer, wherein the second polysilicon layer is formed by introducing the silicon-containing gas only,
    wherein the silicon-containing gas comprises silane or disilane, and the inhibitive gas comprises hydrogen, and
    wherein a flow rate ratio of the silicon-containing gas to the inhibitive gas is from about 1:50 to about 1:60.

2. The method of claim 1, wherein the first polysilicon layer is amorphous while the second polysilicon layer is crystallized.

3. The method of claim 1, wherein the first polysilicon layer has a first grain size, the second polysilicon layer has a second grain size, and the first grain size is smaller than the second grain size.

4. The method of claim 1, wherein a flow rate of the silicon-containing gas is about 50-60 sccm, and a flow rate of the inhibitive gas is about 2,500-3,600 sccm.

5. The method of claim 1, wherein a flow rate of the silicon-containing gas keeps the same, and a flow rate of the inhibitive gas keeps the same or increases over time.

6. The method of claim 1, wherein the first polysilicon layer and the second polysilicon layer are formed at the same temperature of about 700-750° C.

7. The method of claim 1, wherein a temperature of forming the first polysilicon layer is lower than a temperature of forming the second polysilicon layer.

8. The method of claim 7, wherein the temperature of forming the first polysilicon layer is about 550-650° C., and the temperature of forming the second polysilicon layer is about 700-750° C.

9. The method of claim 1, wherein a thickness of the first polysilicon layer is smaller than a thickness of the second polysilicon layer.

10. The method of claim 9, wherein a thickness ratio of the first polysilicon layer to the second polysilicon layer is from about 1:2.5 to about 1:6.

11. The method of claim 10, wherein the thickness of the first polysilicon layer is about 100-200 Å, and the thickness of the second polysilicon layer is about 500-600 Å.

12. The method of claim 1, further comprising performing a first ion implantation process after the step of forming the second polysilicon layer to dope the second polysilicon layer.

13. The method of claim 12, further comprising performing a second ion implantation process before the step of performing the first ion implantation process, so as to form a barrier layer in the second polysilicon layer to prevent dopants from diffusing to the first polysilicon layer.

* * * * *